United States Patent [19]

Gordon et al.

[11] Patent Number: 5,742,065
[45] Date of Patent: Apr. 21, 1998

[54] HEATER FOR MEMBRANE MASK IN AN ELECTRON-BEAM LITHOGRAPHY SYSTEM

[75] Inventors: Michael Stuart Gordon, Somers, N.Y.; Rodney Arthur Kendall, Ridgefield; David John Pinckney, Danbury, both of Conn.; James Louis Speidell, Poughquag, N.Y.

[73] Assignee: International Business Machines Corporation, Armonk, N.Y.

[21] Appl. No.: 787,069

[22] Filed: Jan. 22, 1997

[51] Int. Cl.⁶ .................................................. H01J 31/08
[52] U.S. Cl. .................................. 250/492.23; 250/492.2
[58] Field of Search .......................... 250/492.23, 492.2, 250/492.1, 491.1, 398; 378/35, 34; 219/121.25

[56] References Cited

U.S. PATENT DOCUMENTS

| | | | |
|---|---|---|---|
| 3,790,412 | 2/1974 | Moline | 250/492.1 |
| 4,980,536 | 12/1990 | Asch et al. | 219/121.68 |
| 5,155,749 | 10/1992 | DiMilia et al. | 378/35 |
| 5,428,203 | 6/1995 | Kusunose | 219/121.25 |

FOREIGN PATENT DOCUMENTS 59-075624   4/1984   Japan .

OTHER PUBLICATIONS

H. C. Pfeiffer, "Variable Spot Shaping for Electron–Beam Lithography" J. Vac. Sci. Technol. 15(3), Amer. Vac. Society, pp. 887–890, May/Jun. 1978.

S.D. Berger, et al, "Projection Electron–Beam Lithography: A New Approach" J. Vac. Sci. Technol. B9(6), Amer. Vac. Society, pp. 29996–29999, Nov./Dec. 1991.

H. Itoh, et al., "Cell Projection Column for High Speed Electron Beam Lithography System" J. Vac. Sci. Technol. B(10)6, Amer. Vac. Society, pp. 2799–2803, Nov./Dec. 1992.

X. Pan, et al, "Improved Electron Beam Pattern Writing in Sio2 with the Use of a Sample Heating Stage" Appl. Phys. Lett. 63(10), Amer. Inst. of Physics, pp. 1441–1442, Sep. 6, 1993.

Primary Examiner—Keit T. Nguyen
Attorney, Agent, or Firm—H. Daniel Schnurmann

[57] ABSTRACT

A method for reducing contamination in a silicon membrane mask in a lithography system is described. The method includes: doping the top surface of the silicon membrane mask with boron to lower the electrical resistance of the mask; subsequently metalizing the surface of the mask to further lower its electrical resistance; and, finally, applying a voltage between opposite surfaces of the mask, the voltage generating an electric field that passes through the membrane mask, heating the membrane mask. The method further includes: calculating distortions in the shape of each of the patterns within the mask caused by heating the membrane mask; compensating for the proximity of other shapes positioned in the vicinity of each of the patterns; and appropriately modifying the shape of each of the patterns. The above described method can be equally applied to an e-beam system or to an ion-beam lithography system, and both, to stencil masks and to scattering masks.

12 Claims, 3 Drawing Sheets

HEATER FOR MEMBRANE MASK IN AN ELECTRON-BEAM LITHOGRAPHY SYSTEM

FIELD OF THE INVENTION

The present invention relates to stencil and scattering membrane masks used in electron-beam lithography, and more specifically to an integrated heater that reduces contamination on the surface of the mask.

BACKGROUND OF THE INVENTION

Variable-spot-shaping has been extensively used in electron beam lithography over the last 20 years. In typical applications, the beam size at the target is tailored to fit any pattern by positioning spots next to one another, thereby patterning any geometric shape. Generally, spots are shaped by projecting two square apertures simultaneously. The upper aperture is filled uniformly by an electron beam. The image of the upper aperture is made to coincide with the plane of the lower aperture, using magnetic electron lenses. The image of the upper aperture can be shifted or displaced with respect to the lower aperture by means of electric or magnetic deflectors. The resulting triangular, rectangular or square spot is then de-magnified and projected onto an electron-sensitive resist on a silicon wafer, X-ray membrane, or photomask. Multiple spots are then stitched together to form the desired pattern in resist. This method of shaping a spot has been extensively described in the literature, and more specifically, in the article by H. C. Pfeiffer, "Variable spot shaping for electron-beam lithography", published in the Journal of Vacuum Science Technology, Vol. 15(3), May/June 1978, pp. 887–890.

An extension of the variable-spot shaping which has gained popularity over the last half-dozen years relates to electron-beam cell (or character) projection. These extensions can increase the throughput of the electron-beam tool by projecting more pixels in parallel than variable-spot-shaping, particularly for small, repeating features as, for instance, in DRAM cells and the like. In these projection techniques, the lower aperture typically has several features etched into it: a centrally-located square (for writing variable-shaped features) and several cells (or characters) or both. These apertures will, henceforth, be referred to as "stencil masks". The cell (or character) apertures are fabricated using lithographic techniques to ensure accurate patterning of the projected image, as described by Hidetoshi Satoh, et al., in SPIE Vol. 2254, Photomask and X-Ray Technology (1994), Vol. 122, and by H. Itoh, et al., in the Journal of Vacuum Science Technology B, Vol. 10, No. 6, November/December 1992.

An alternative to cell projection is found in scattering projection electron-beam lithography, as described, for instance, by S. D. Berger, et al., Journal of Vacuum Science Technology B(9), November/December 1991 (2996). In the above-mentioned cases, the lower aperture completely absorbs the incident beam. In scattering projection, the aperture material is mostly transparent to the incident beam, and a thin layer of high atomic number (scatterer) is patterned on top. The incident electrons are scattered differently as they pass through the transparent or scatterer regions. These masks will be referred henceforth as "scattering masks".

Any non-conductive contamination on the surface of the apertures tends to "charge" and cause deflection of the beam in an undesirable and uncontrollable way. A major source of contamination is from hydrocarbons within the electron beam system; for example resist, pump oil vapor, O-ring grease and the like. These hydrocarbons tend to be deposited onto the aperture by either surface diffusion or by molecular transport within the vacuum.

Heating an aperture to an elevated temperature of, e.g., approximately 200° C., has been effective in eliminating the hydrocarbon buildup within scanning electron microscopes (SEM). Those skilled in the art recognize that a common technique to heat apertures is by direct, resistive heating, i.e, the aperture is in thermal contact with a resistive heater as described, e.g., by Xiaodan Pan, et. al., in the Applied Physics Letters 63 (10), 6 Sep. 1993, (1441). In view of the fact that stencil and scattering masks are typically fabricated on thin (several micron thick) silicon membranes, it is conceivable that directly heating the membrane will break it.

Japanese patent No. 59-075624 discusses etching an aperture in the middle of a bridge on top of an oxide-coated silicon wafer (with a larger hole than that in the aperture). Current is passed between the metallized bridge and the silicon wafer, thus heating the aperture. While this technique can be used to heat the aperture (or stencil and scattering masks), it requires significant processing to form the bridge on top of the aperture.

In U.S. Pat. No. 4,980,536, to Asch et al., a method is described where a high-powered excimer laser is used to clean the surface of an x-ray membrane. This technique may be applied to clean in-situ the surface of an aperture (or the stencil of scattering mask) after it has been contaminated, but it does not address the problem of keeping the aperture clean in the first place.

In U.S. Pat. No. 5,428,203, to Haruhiko Kusunose et al., a stencil mask is heated by an external laser beam. The temperature of the mask is kept constant by a feedback circuit that measures and corrects for temperature excursions from the nominal. This method keeps the mask at a constant temperature to minimize image size variations of the resulting spot at the target by variations of the mask temperature. It is obvious to those skilled in the art, that this technique can also be used to heat the stencil mask to elevated temperatures required to keep the mask clean of contamination. The drawback to the technique is that it requires an external source to heat the membrane (laser), as well as a vacuum window and mirrors to deflect the laser beam to the mask, a drawback which, likewise, also applies to the previously cited patent.

In Japanese Patent No. JP62-272529, a stencil mask is formed with a loop of nichrome wire inside. Current passing through the loop heats the aperture. This technique also relies on additional steps in the fabrication flow to allow for the insertion, or fabrication of the resistive-wire element.

In U.S. Patent No. 5,155,749, to DiMilia et al., a circular aluminum ring provided with a heater is inserted in the outer portion of an X-ray mask. As the aluminum ring heats, it changes the stress in the membrane, which in turn causes a variable magnification of a pattern on the mask membrane. Those skilled in the art will recognize that this heater could be used to heat up the membrane, too, albeit inefficiently.

OBJECTS OF THE INVENTION

Accordingly, it is the object of the present invention to provide a method for reducing or eliminating contaminants from the surface of a membrane mask used in an e-beam or in an ion-beam lithography system.

It is another object of the present invention to provide a heater by passive means for stencil or scattering masks used for electron-beam lithography using standard x-ray membrane mask techniques.

It is still another object of the present invention to eliminate contamination by providing uniform heating to a large area stencil or scattering mask.

It is a more particular object of the present invention to create an integrated heater by using the doped surface regions of a silicon substrate to be utilized as ohmic contacts, whereas the bulk silicon acts as a resistor for heating the mask.

It is a further object of the present invention to use boron doping to decrease the electrical resistance near the surface of both sides of the substrate to allow electrical current to flow, thereby using the wafer as a passive heater element.

It is yet a further object of the present invention to compensate for the dimensional increase in the features patterned in the stencil membrane as it is heated by providing appropriate corrections that take into account any distortions.

It is a more particular object of the present invention to modify the previously mentioned corrections by factoring in for the proximity of other patterns or shapes which affect the shape and the extent of the distortions.

SUMMARY OF THE INVENTION

In accordance with one aspect of the invention, there is provided a method of reducing contamination in a silicon membrane mask comprising the steps of: doping at least one surface of the silicon membrane mask with boron to lower the electrical resistance of the mask; and applying a voltage between opposite surfaces of the membrane mask wherein, in the previous step, at least one of the opposite surfaces has been doped by boron, the voltage generating an electric field that passes through the membrane mask, heating the membrane mask.

In another aspect of the invention, in a lithography system, a method is provided for reducing contamination in a silicon stencil mask having a plurality of patterns, wherein at least one of the patterns perforates the silicon stencil mask, the method including the steps of: doping with boron at least one surface of the silicon membrane mask to lower the electrical resistance of the mask; metalizing at least one of its surfaces to further lower the electrical resistance of the membrane mask; and applying a voltage between opposite surfaces of the membrane mask wherein, in the previous step, at least one of the opposite surfaces has been doped by boron, the voltage generating an electric field that passes through the membrane mask, heating the membrane mask.

In still another aspect of the present invention, a method is provided for reducing contamination that includes the additional steps of: calculating distortions in the shape of each of the patterns within the mask caused by the heating of the membrane mask; compensating for the proximity of other shapes positioned in the vicinity of each of the patterns; and appropriately modifying the shape of each of the patterns.

The above described methods apply equally to an e-beam system or to an ion-beam lithography system, to stencil masks (i.e., having a plurality of patterns, wherein at least one of the patterns perforate the mask) or to scattering masks (i.e., having a plurality of non-perforating patterns).

BRIEF DESCRIPTION OF THE DRAWINGS

While the specification concludes with claims particularly pointing out and distinctly claiming that which is regarded as the present invention, details of the preferred embodiments of the invention may be more readily ascertained from the following technical description when read in conjunction with the accompanying drawings, wherein:

DESCRIPTION OF A PREFERRED EMBODIMENT

Figure 1A:
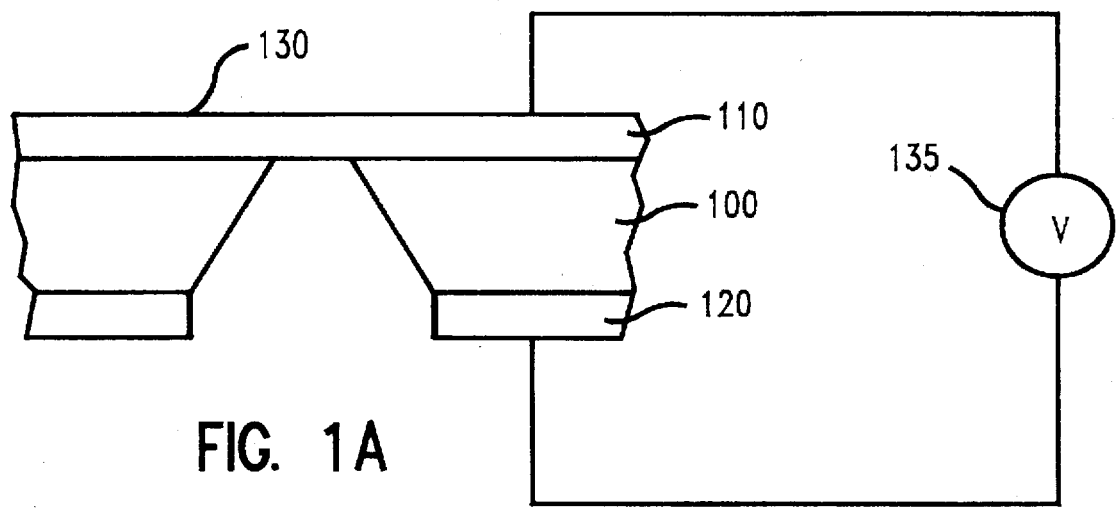
FIGS. 1a–1b show, respectively, a schematic diagram of a side view and a top-down view of a heated membrane mask, in accordance with the present invention.
Figure 1B:
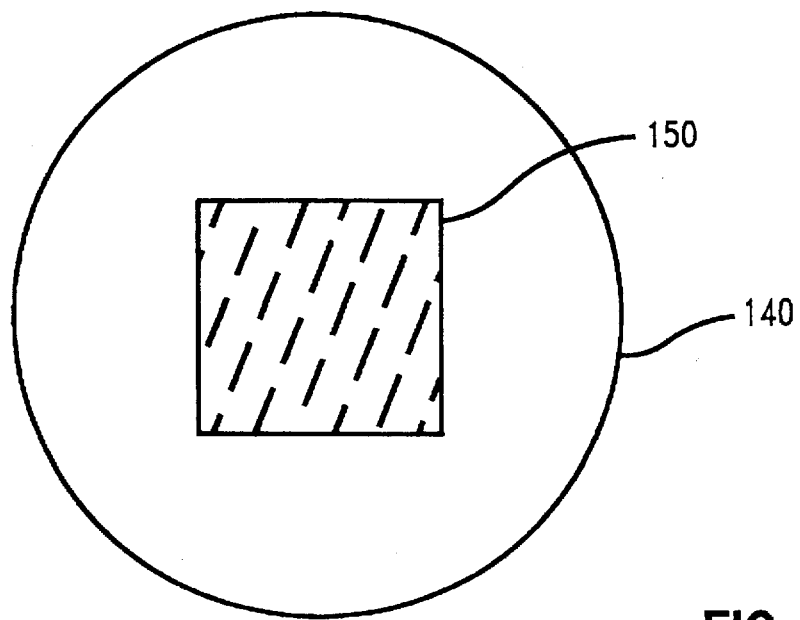

In a preferred method for fabricating silicon x-ray membranes for use in x-ray lithography, boron is diffused into the bulk silicon. The boron acts as an etch-stop when a wet etch is used to form a membrane window. This is shown schematically in FIG. 1a depicting a cross-section of an x-ray membrane 130. This membrane is typically about 2 μm thick. The upper and lower boron doped surfaces are shown by numerals 110 and 120, respectively, and the bulk silicon by 100. The membrane 130 is lithographically defined and reactive-ion etched through lower boron doped surface 120 and bulk silicon 100 to the upper boron surface 110. A top view of the x-ray membrane is shown in FIG. 1b. The membrane is, preferably, supported by a pyrex ring or by a low-expansion glass 140. The membrane portion of the structure 130 can be fabricated square or round, and is fabricated of a size and shape consistent with the requirements of the chip fabricated using the mask.

The boron on the surface of the x-ray mask (110 and 120 in FIG. 1a) has a lower electrical resistivity than the bulk silicon 100. The boron-doped surfaces act as ohmic contacts, making it possible to pass current through the bulk silicon wafer 100, (in a direction perpendicular to the surface), and using the silicon wafer 100 as a resistive heating element. Of course, the outer rim (circumference) of the wafer needs to be protected (i.e., electrically-isolated) to prevent a short-circuit about the bulk silicon wafer. Better electrical contact could be made to the boron-doped surfaces by masking off the membrane area and by evaporating a thermally-matched metal onto both surfaces of the wafer. A voltage source 135 is attached to opposite surfaces of the membrane to generate a current that heats the membrane mask.

The membrane portion of the x-ray mask contains features that are defined lithographically. In the case of a stencil mask for use in an e-beam projection lithography, an electroplating base and a resist are applied to the membrane. The membrane is then exposed, using for this purpose the electron-beam from the e-beam lithography tool. Subsequently, the resist is developed and the membrane is electroplated with gold. Using the processed mask in an e-beam projection tool, the gold stops the primary e-beam and provides sufficient contrast between those and adjacent areas. The electrons flood the open areas of the membrane. The resulting shape of the beam (square, rectangle, cell, ...) is then demagnified (about 25×) in the lower regions of the column and it is projected onto a resist-coated wafer. For 256 Mb DRAMs, the minimum feature size (i.e., the critical dimension) is 0.25 μm, which corresponds to features on the mask of about 6 μm. The stencil mask must be heated during exposure to prevent contamination build-up. Experimental values have shown that this heating process raises the temperature of the bulk silicon to approximately 200° C. in vacuum, with the application of about 0.67 W/cm² by applying the voltage across the membrane.

In the absence of heating, the contamination can have two detrimental effects on the beam in a projection e-beam lithography system. First, the contamination can charge the beam as it impinges on the mask. This charging can cause the beam to be deflected into undesired and uncontrollable areas. Secondly, the contamination can grow sufficiently thick to be imaged by the beam. By way of example, the effect of contamination build-up in the corners of square features in the mask will be rounding of the same corners in the resist at the target. On the other hand, there is a drawback of heating the stencil membrane in that features become distorted and change dimensions as they are heated, as will be explained hereinafter.

Figure 2A:
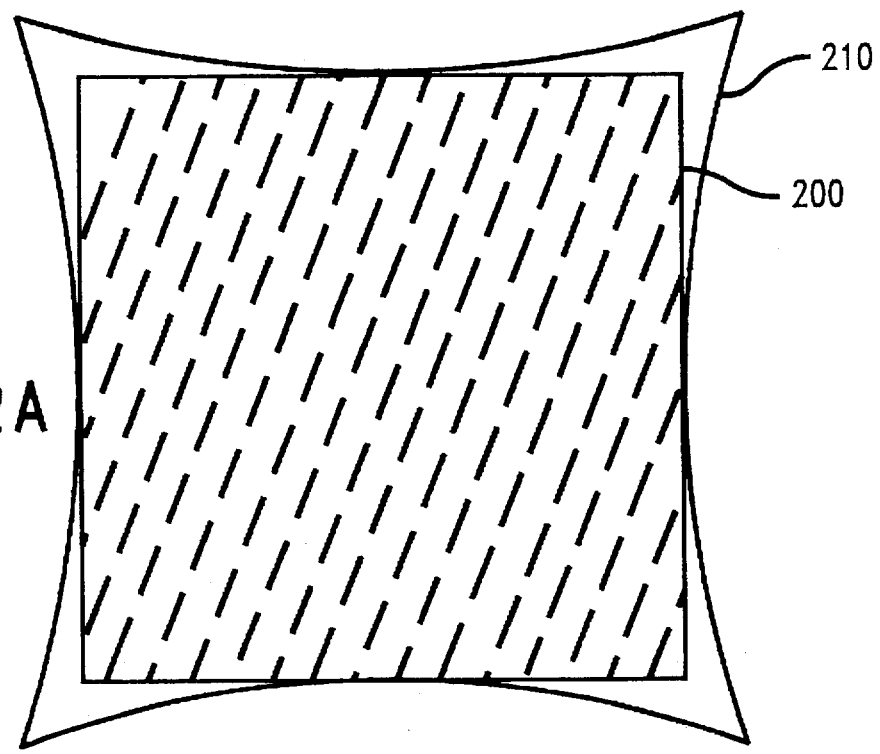
FIGS. 2a–2b show the distortion and changes in dimensions that occur as a result of heating the membrane mask, in accordance with the present invention.
Figure 2B:
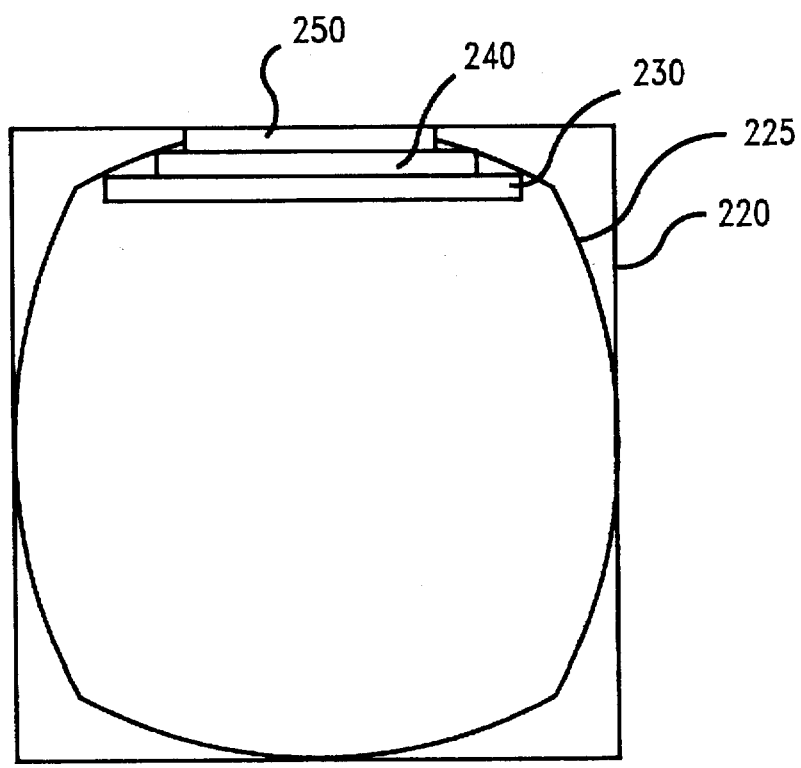

Referring to FIG. 2a, a square 200 is shown as an isolated feature on the membrane. When subjected to an elevated temperature, the membrane distorts, as depicted in 210. Practitioners of the art will readily recognize the manner how squares or other similar features distort with temperature. It is, therefore, of prime importance to design a shape that ends up with the correct dimensions and shape when heated. This is shown by feature 225 seen in FIG. 2b. Shape 225 is a barrel-shaped feature "distorted" to the desired shape 220 when heated. Of course, the magnitude of the distortion is temperature-dependent, and must be adequately modeled using finite element models with appropriate boundary-value conditions. This "temperature-specific emulation" can then be added to other emulations (like back-end of the line, stress caused by gold plating, etc.) that are already included in the process fabrication of high-resolution masks, stencils, X-rays, and the like. The barrel shape can be fabricated by a series of rectangular slivers 230, 240, and 250 as shown in FIG. 2b.

Figure 3:
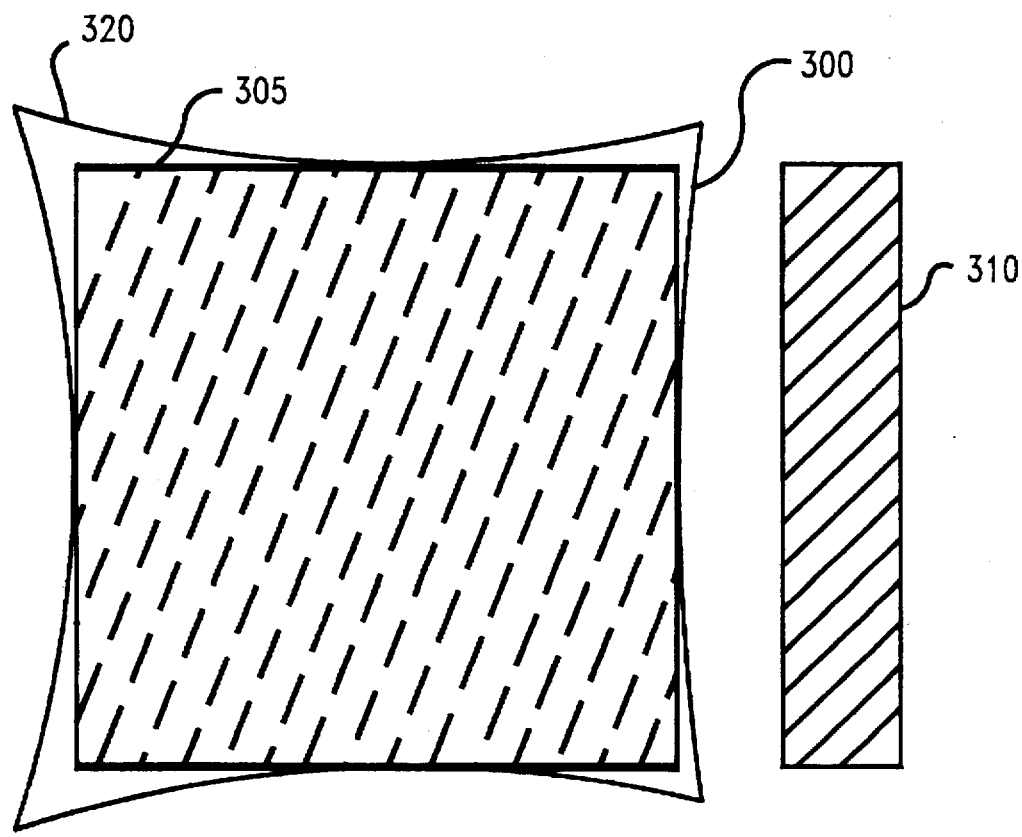
FIG. 3 shows an asymmetric distortion of a pattern of the membrane, highlighting the proximity effect in the presence of another shape.

A more general arrangement of shapes is shown in FIG. 3, wherein a square 305 is shown adjacent to a rectangle 310 (which for the sake of argument is shown undistorted). The edge of the square nearest to the rectangle 300 tends to distort less than the edge farther away 320, since it remains cooler. It is clear that in order to adequately model patterned shapes in the membrane and their way of distorting with temperature, each shape within the entire membrane must be evaluated with respect to its neighboring shapes, subject to appropriate boundary conditions and keeping in mind that the membrane frame remains at a fixed temperature. This shape-by-shape evaluation of the temperature induced distortion is similar to the proximity effect that occurs in e-beam lithography, wherein the dose (i.e., amount of beam current, measured in $\mu$coulombs/cm$^2$) from neighboring spots on the target exposes unwanted areas. Proximity-effect algorithms compute the dose to be applied to all the shapes from a desired or undesired exposure and then appropriately modifies the dose so that all spots receive the correct amount. Furthermore, in shaped-beam lithography, a trade-off exists between accuracy and throughput of the tool. In order to achieve the optimum throughput, the maximum size spot should be written at all times. However, for non-rectangular shapes, it is necessary to write smaller spots to maintain higher accuracy in replicating the pattern. This process is continued until the granularity of the written shape is acceptable. Usually, large rectangles are "sleeved", i.e., the middle of the large rectangle is written with large spots, whereas the perimeter is sleeved with tiny rectangles (having one axis of small and fixed dimensions, i.e., 0.25 $\mu$m, and a second axis of variable width, i.e., 2.0 $\mu$m). In this manner, the perimeter is written with spots having the best possible resolution and the entire large rectangle ends up having an optimum resolution determined by the perimeter. The tool post-processor contains algorithms which break down all shapes to appropriate size rectangles and then compute a dose such that the spot ends up with the correct dose with the best resolution. Since the post-processor has already broken all the shapes to simple rectangles, the job of computing the temperature effects on the distortion (on a shape-by-shape basis) is merely an added subroutine which solves the boundary-value problem. Preferably, algorithms that best handle distortions of this kind (given a set of ideal-sized shapes) are iterative in nature. This makes them particularly well suited in modifying the size of the shapes and determining the final shapes which are applicable for elevated temperatures, once it has been established that they are correct.

The invention has been described herein in terms of a Si membrane mask. Practitioners of the art will readily appreciate that other semiconductors could be used just as effectively. Examples of other materials suitable for use as membrane masks include Ge, SiGe, GaAs and the like.

Whereas the invention has been described in terms of a specific embodiment, it is evident in view of the foregoing description that other alternatives, modifications and variations will be apparent to those skilled in the art. Thus, the invention is intended to encompass all such alternatives, modifications and variations which fall within the scope and spirit of the invention and the appended claims.

What is claimed is:

1. A method of reducing contamination in a silicon membrane mask comprising the steps of:

doping at least one surface of said silicon membrane mask with boron to lower the electrical resistance of said mask; and applying a voltage between opposite surfaces of said membrane mask, wherein at least one of said opposite surfaces has been doped by said boron, said voltage generating an electric field that passes through said membrane mask, heating said membrane mask.

2. The method of reducing contamination in a silicon membrane mask as recited in claim 1, further comprising the step of:

metalizing at least one surface of said membrane mask to further lower the electrical resistance of said membrane mask.

3. The method of reducing contamination as recited in claim 1, wherein said membrane mask is made of the group that consists of Ge, SiGe and GaAs.

4. In a lithography system, a method of reducing contamination in a silicon membrane mask having a plurality of patterns comprising the steps of:

doping at least one surface of said silicon membrane mask with boron to lower the electrical resistance of said mask; and applying a voltage between opposite surfaces of said membrane mask, wherein at least one of said opposite surfaces has been doped by said boron, said voltage generating an electric field that passes through said membrane mask, heating said membrane mask.

5. The method of reducing contamination as recited in claim 4, wherein said lithography system is an e-beam system.

6. The method of reducing contamination as recited in claim 4, wherein said lithography system is an ion-beam system.

7. The method of reducing contamination as recited in claim 4, further comprising the step of:

metalizing at least one surface of said membrane mask to further lower the electrical resistance Of said membrane mask.

8. In a lithography system, a method for reducing contamination in a silicon stencil mask having a plurality of patterns, wherein at least one of said patterns perforate the silicon stencil mask, comprising the steps of:

doping at least one surface of said silicon stencil mask with boron to lower the electrical resistance of said mask; and applying a voltage between opposite surfaces of said stencil mask, wherein at least one of said opposite surfaces has been doped by said boron, said voltage generating an electric field that passes through said stencil mask, heating said stencil mask.

9. The method for reducing contamination as recited in claim 8, further comprising the step of:

metalizing at least one surface of said stencil mask to further lower the electrical resistance of said stencil mask.

10. The method for reducing contamination as recited in claim 8, further comprising the steps of:

calculating distortions in the shape of each of said patterns within said mask caused by the heating of said stencil mask;

compensating for the proximity of other shapes positioned in the vicinity of each of said patterns; and modifying the shape of each of said patterns.

11. A method of reducing contamination in a silicon scattering mask having a plurality of non-perforating patterns in a lithography system, comprising the steps of:

doping at least one surface of said silicon scattering mask with boron to lower the electrical resistance of said mask; and applying a voltage between opposite surfaces of said scattering mask, wherein at least one of said opposite surfaces has been doped by said boron, said voltage generating an electric field that passes through said scattering mask, heating said scattering mask.

12. The method of reducing contamination as recited in claim 11, further comprising the step of:

metalizing at least one surface of said scattering mask to further lower the electrical resistance of said scattering mask.

\* \* \* \* \*